United States Patent [19]

Miyazaki

[11] Patent Number: 4,853,078

[45] Date of Patent: Aug. 1, 1989

[54] PROCESS FOR GROWING A MULTI-COMPONENT CRYSTAL

[75] Inventor: Kenji Miyazaki, Osaka, Japan

[73] Assignee: Sumitomo Electric Industries, Ltd., Osaka, Japan

[21] Appl. No.: 268,650

[22] Filed: Nov. 9, 1988

Related U.S. Application Data

[63] Continuation of Ser. No. 41,450, Apr. 23, 1987, abandoned.

[30] Foreign Application Priority Data

Apr. 23, 1986 [JP] Japan .................................. 61-94336

[51] Int. Cl.$^4$ ............................................. C30B 29/46
[52] U.S. Cl. ..................... 156/616.4; 156/DIG. 72; 156/DIG. 77; 156/DIG. 87; 156/DIG. 90
[58] Field of Search ......... 156/616.1, 616.4, DIG. 72, 156/DIG. 77, DIG. 89, DIG. 90

[56] References Cited

U.S. PATENT DOCUMENTS

| | | | |
|---|---|---|---|
| 4,368,098 | 1/1983 | Manasevit | 156/611 |
| 4,379,733 | 4/1983 | Pastor et al. | 156/616 R |
| 4,404,265 | 9/1983 | Manasevit | 156/611 |
| 4,528,062 | 7/1985 | Kleinhans et al. | 156/DIG. 70 |
| 4,568,397 | 2/1986 | Hoke et al. | 156/613 |
| 4,619,811 | 10/1986 | Nishizawa | 156/601 |
| 4,632,710 | 12/1986 | Van Rees | 156/613 |
| 4,689,094 | 8/1987 | Van Rees | 156/613 |
| 4,704,258 | 11/1987 | Hemmerdinger | 156/611 |

*Primary Examiner*—William R. Dixon, Jr.
*Assistant Examiner*—Andrew Griffis
*Attorney, Agent, or Firm*—Kerkam, Stowell, Kondracki & Clarke

[57] ABSTRACT

A process for growing in a sealed reaction container a multi-component type crystal from the melt of a starting material consisting of more than three elements of the multi-component crystal. The sealed reaction container is divided into a reaction zone and a vapor pressure control zone which are in communication with each other through at least one opening. The starting material for the multi-component crystal is charged in the reaction zone while a vapor pressure control material consisting of more than two components of the multi-component crystal is charged in the vapor pressure control zone. The temperature in the reaction control zone is adjusted and maintained at a predetermined value to grow the crystal from the melt under a controlled vapor pressure.

11 Claims, 4 Drawing Sheets

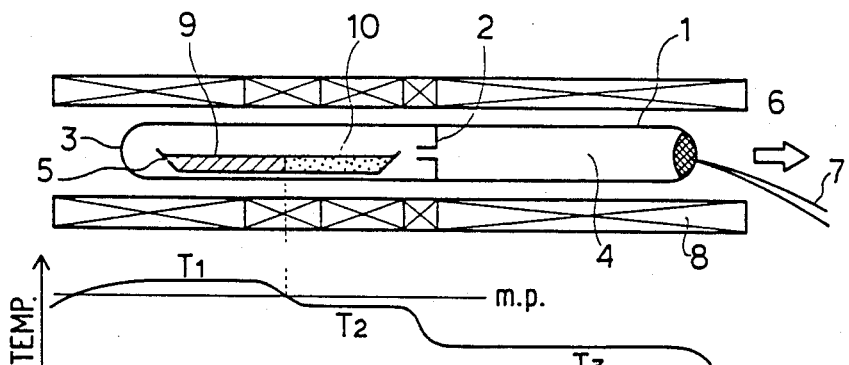
FIG.1
FIG.2
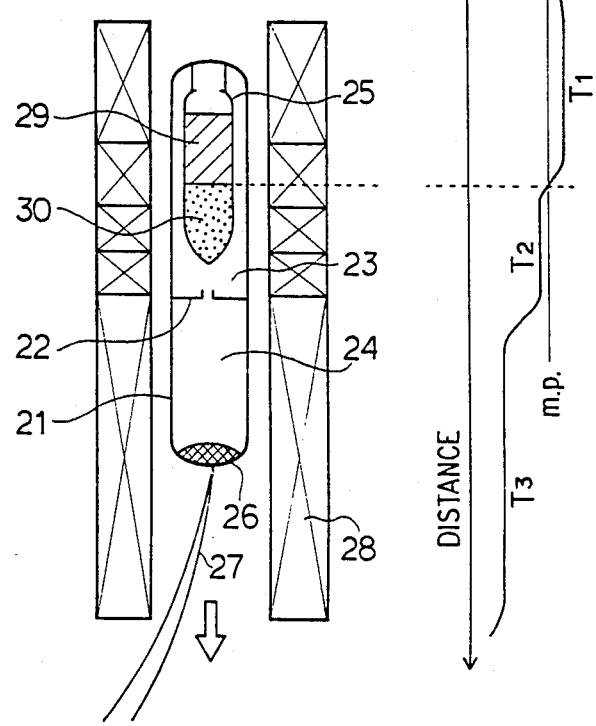
FIG.3
FIG.4

PROCESS FOR GROWING A MULTI-COMPONENT CRYSTAL

This is a continuation of application Ser. No. 041,450, filed Apr. 23, 1987, abandoned.

BACKGROUND OF THE INVENTION

1. Field of the Invention

The present invention is related to a process for growing a crystal comprising more than three elements (hereinafter, referred as a multi-component crystal), more particularly a process for growing a multi-component crystal having reduced variation of composition in crystal with a higher yield.

2. Description of the Related Art

Single crystals of compound semiconductor, oxide or the like are used in a wide variety of solid-state devices in the field of microelectronics, optoelectronics etc.

Recently, new materials consisting of a plurality of elements have been developed in order to improve functions of the devices and to give them additional functions. For example, mixed crystals or solid solutions consisting of more than three elements are used, since physical properties (for example, the lattice constant, the band gap, the light reflectance, the thermal expansion coefficient, mobility of electrons and chemical properties (surface energy, the resistance to chemicals etc.) of two-component compound semiconductors are fixed unconditionally according to elements of which the two-component compound semiconductor is made, and hence these properties can not be improved or controlled artificially.

The merits of such multi-component mixed crystal are that there is a wide range of selection in their constituent elements, their proportions or the like and hence it is possible to obtain a variety of compound semiconductors having desired properties. This fact is the same in case of a single crystal of oxide which consists of more than three constituent elements and several kinds of which have been proposed.

The multi-component crystal can be prepared by a variety of methods. In a method in which multi-component crystal is grown from the melt of material composed of plural elements in a sealed reaction tube, Vertical Bridgman method, Traveling Heater method or the like can be utilized.

FIGS. 7 and 8 illustrates an examples of the process for growing crystal of multi-component compound semiconductor by the conventional Vertical Bridgman Method, in which FIG. 7 shows a stage of mixed crystal growth and FIG. 8 shows the temperature distribution of a furnace employed for this process. Now, we will explain an outline of this process by describing a case in which a mixed crystal having a composition: $A_{1-x}B_xC$ (wherein, A, B, C denote consistent elements, and $0<x<1$) is produced.

After a mixed crystal (a seed crystal) having the composition of $A_{1-x}B_xC$ is placed at the bottom of a reaction tube 51 made of quartz etc., predetermined amounts of the material 52 for a miaxed crystal, for example, $A_{1-x}C_{1-x}$ and $B_xC_x$ are charged onto the seed crystal. Then, the pressure in the reaction tube 51 is reduced to create a vacuum condition. The resulting reaction tube 51 under vacuum is placed at the determined position in a furnace (not shown) having the temperature distribution presented in FIG. 8 to melt the materials 52 of mixed crystal. The seed crystal starts to grow with being in contact with the melt 52 of the materials. Thereafter, the reaction tube 51 is moved slowly downward in the direction of an arrow shown in FIG. 7, so that the liquid-solid interface moves upwardly in reaction tube 51. In this manner, a mixed crystal is prepared by growing the resulting crystal part 53.

FIGS. 9 and 10 illustrate examples of the process for growing a mixed crystal for compound semiconductors by the conventional Traveling Heater Method, in which FIG. 9 shows briefly a stage of mixed crystal growth and FIG. 10 shows the temperature distribution of a furnace employed for this process. In this example, the starting materials, for instance, $A_{1-x}C_{1-x}$ (64) and $B_xC_x$ (65) are placed in the manner to confront each other along the vertical axis of reaction tube 61 and the temperature distribution is controlled to partially form the molten zone 62. Other operations of this process for producing a mixed crystal 63 are substantially the same as in the Vertical Bridgman Method.

In the prior art, however, it is difficult to produce a uniform crystal having no lattice defects such as vacancies and also it is impossible to control a stoichiometrical composition, because a part of the consistent element in the starting material having a higher vapour pressure evaporates when the starting material is melted. In fact, the starting material of the mixed crystal and also the resulting mixed crystal itself are mostly such compounds having higher vapour pressure under a molten condition.

For example, when a mixed crystal of $Cd_{1-x}Zn_xTe$ is produced according to the prior art, its components Cd and Zn having higher vapour pressures are apt to evaporate and hence the resulting crystal contains vacancies of Cd and Zn and becomes mostly a P-type conduction type. Thus, the prior art is thoroughly imperfect in such aspect as control of the composition in a crystal and stoichiometrical control. Therefore, in the conventional technique, it is difficult to produce multi-component crystal having stable or constant properties with a higher yield due to fluctuation of composition and deviation of stoichiometry.

Accordingly, it is an object of the present invention to provide a method for growing a multi-component type crystal which is stoichiometrically stable or constant in composition with a higher yield and without changing conventional manufacturing facilities or units.

SUMMARY OF THE INVENTION

In accordance with the present invention, a method for growing a multi-component type crystal from melt of the starting material consisting of more than three elements in a sealed container is characterized by providing such a sealed container for reaction as having a reaction zone and a vapour pressure control zone which are in communicated with each other through a small opening or openings, charging the starting material for said multi-component crystal in said reaction zone, while charging vapour pressure control material consisting of more than two components of said crystal in the vapour pressure control zone, and then maintaining the vapour pressure control zone at a predetermined temperature to control the vapour pressure in the reaction system so that a crystal is grown from the melt of the starting material.

The sealed reaction container may have any shape, cross section and/or dimension and may be made of a wide variety of materials.

The starting material can be selected from a wide variety of combination of elements. Particularly, the elements selected from II, III, IV, V and VI groups of The Periodic Table can be combined to provide a variety of combinations such as II–VI, for example, Cd–Zn–Te and Cd–Te–Se, III–V for example Ga–As–P or the like. The multi-component crystal may have a variety of compositions such as $D_{1-x}^{II}E_x^{II}F^{VI}$ wherein, D and E denote elements selected from II group, and F denotes elements selected from VI group of the periodic table respectively and $0<x<1$, or $G^{II}H_{1-z}^{VI}I_z^{VI}$ wherein, G is an element selected from II group and H and I are elements selected from VI group of the periodic table respectively and $0<Z<1$. In case of oxide type multi-component crystal, the starting material may contain oxyen and/or oxide of any element.

As the vapour pressure control material, it is preferable to use elements or components which have high vapour pressure and selected from components of the multi-component crystal.

In practice, when the stoichiometrical multi-component crystal is grown from the melt of starting material in the sealed container for reaction, it is necessary to control the vapour pressure in the sealed reaction container at the value appropriate for obtaining the stoichiometric compound. According to the present invention mentioned above, it is possible to control the vapour pressure in the whole reaction zone by providing the sealed reaction container with the vapour pressure control zone containing therein the vapour pressure control material consisting of at least two constituent elements or components of the multi-component crystal and by maintaining the vapour pressure control zone at a predetermined temperature to evaporate said vapour pressure control material so as to make such a vapour pressure as is appropriate for obtaining the stoichiometric compound. Thus, the present invention allows to grow a multi-component crystal having little change in composition and in deviation from the stoichiometry and reduced number of lattice defects.

The objects and advantageous features of the present invention will become apparent from the following description of the preferred embodiments taken in conjunction with the accompanying drawings.

BRIEF DESCRIPTION OF THE DRAWINGS

FIG. 1 illustrates a schematical drawing of an apparatus used when the process of the present invention is applied to the three-Temperature Horizontal Bridgman Method, FIG. 2 shows an example of the temperature distribution in the apparatus of FIG. 1, FIG. 3 illustrates a schematical drawing of an apparatus used when the process of the present invention is applied to the three-Temperature Vertical Bridgman Method, FIG. 4 shows an example of the temperature distribution in the apparatus of FIG. 3.

DESCRIPTION OF THE PREFERRED EMBODIMENTS

Figure 5:
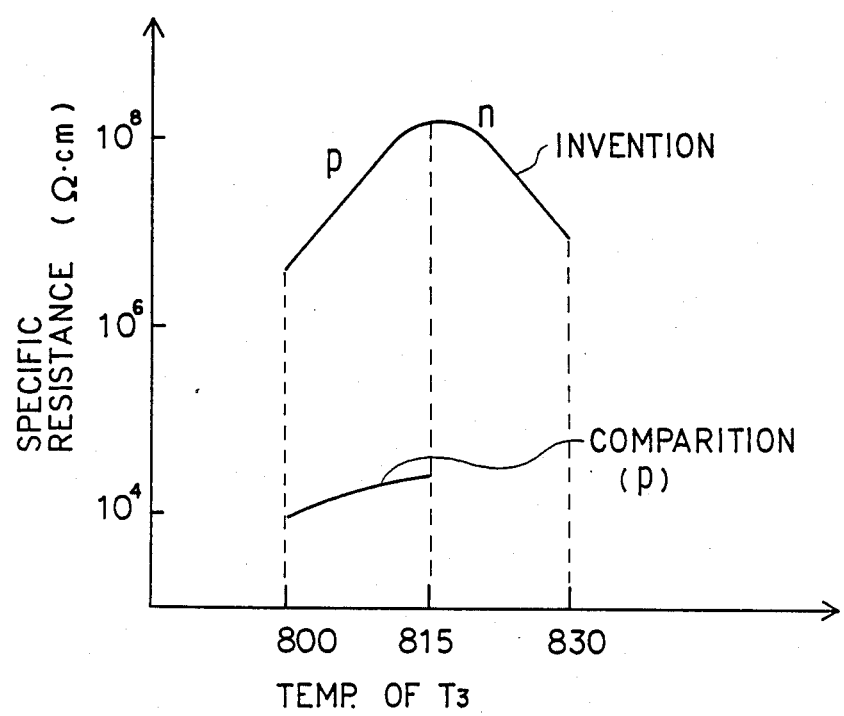
FIG. 5 is a drawing showing a relation between the temperature in the vapour control zone and the specific resistance of crystals produced according to the present invention and a comparative example.

FIG. 1 shows an apparatus employed when the process of the present invention is applied to the three-Temperature Horizontal Bridgman Method. FIG. 1 shows an example of the temperature distribution controlled by a furnace in the apparatus of FIG. 1, wherein $T_1$ represents a temperature which is higher than the melting point of a mixed crystal, $T_2$ represents a temperature which is lower than the melting point but higher than $T_3$ and $T_3$ represents a temperature which is necessary to heat vapour pressure control material 6 required to hold the vapour pressure appropriate for obtaining the stoichiometric compound in the reaction system. The apparatus shown in FIG. 1 consists of mainly reaction tube 1 made of material such as quartz, divided by separating member 2 having a small opening into the reaction zone 3 and vapour pressure control zone 4, and being under vacuum or an inert gas atmosphere. In reaction zone 3, there is placed a boat made of material such as quartz, graphite or BN to be loaded with the starting material for a multi-component crystal. The vapour pressure control zone 4 is provided with a thermocouple 7 for measuring the temperature of the vapour pressure control material 6, so that the temperature in the furnace 8 is adjusted according to the measured temperature. The furnace 8 is mounted around the reaction tube 1 along the horizontal axis of reaction tube 1 and is composed of plural parts, each of which can be controlled independently.

A process according to the present invention will be explained by reference to an example for growing mixed crystal of ternary II–VI group compound semiconductor having a composition of $Cd_{1-x}Zn_xTe$ in the apparatus shown in FIG. 1.

At first, boat 5 shown in FIG. 1 is loaded with a mixture of $Cd_{1-x}Te_{1-x}$ and $Zn_xTe_x$ as the starting materials for the mixed crystal. Among the elements forming said mixed crystal of $Cd_{1-x}Zn_xTe$, Cd and Zn have higher vapour pressures, and hence it is necessary to control the vapour pressures of these two elements simultaneously in order to obtain a stoichiometrical mixed crystal of $Cd_{1-x}Zn_xTe$. Therefore, an alloy having a composition $Cd_{1-y}Zn_y$ $(0<y<1)$ as the vapour pressure control material 6 is charged in the vapour pressure control zone 4 so as to create a vapour pressure appropriate for obtaining the stoichiometric compound when the temperature in vapour pressure control zone 4 is maintained at temperature $T_3$. The value of y in the alloy can be determined so as to create the above mentioned vapour pressure according to a desired value of x.

Then, the reaction tube 1 is depressurized so as to create a vacuum. Under this condition, the vapour pressure control zone 4 is heated externally by means of the furnace 8 to the temperature $T_3$ to evaporate Cd and Zn and maintain the vapour pressure in the reaction tube 1 which is appropriate for obtaining the stoichiometric compound.

The reaction zone 3 is heated by means of the furnace 8 to the temperature $T_1$ to melt said materials of mixed crystal charged into boat 5. The resulting melt 9 comes in contact with a mixed crystal (seed crystal) placed in one end of boat 5 (the right end in FIG. 1) to start crystal growth.

Thereafter, the reaction tube 1 is moved slowly in the direction shown by an arrow in FIG. 1, so that the liquid-solid interface is also moved to grow a crystal 10 (the state shown in FIG. 1). After the crystallization is completed, the reaction tube 1 is opened to take out the grown mixed crystal of $Cd_{1-x}Zn_xTe$.

Although the reaction tube (1) is moved with respect to the stationary furnace 8 in above mentioned embodiment, this is not an indispensable feature of the present invention. Thus, the liquid-solid interface between the melt 9 in the boat 5 and the growing crystal 10 can be moved by controlling the distribution or profile of temperature in the reaction tube 1. In this case where the distribution or profile of temperature in the furnace 8 is controlled, the boat 5 is kept stationary so that it is possible to prevent occurrence of lattice defects due to vibration.

FIG. 3 illustrate another embodiment of the present invention showing an apparatus which is applied to the three-Temperature Vertical Bridgman Method. FIG. 4 illustrates a temperature distribution in the apparatus of FIG. 3, wherein $T_1$, $T_2$ and $T_3$ means the same temperatures as in FIG. 2.

In this embodiment, a reaction tube 21 is installed in a furnace 28 placed vertically. The reaction tube 21 has an upper reaction zone 23 and a lower vapour pressure control zone 24 which are separated by a partition wall 22 having a small opening. In the vapour pressure control zone 24, vapour pressure control material 26 is charged and is contacted to a thermocouple 27 through a wall of the tube to detect temperature of the material 26. In the upper reaction zone 23, a crucible 25 is hung from the top of the reaction tube 21 and is charged with a seed crystal and starting material.

When a multi-component crystal is produced in this apparatus, operation is substantially same as FIG. 1. Namely, after the vapour pressure control material 26 and the starting material are charged in the reaction tube 21, the tube 21 is reduced in pressure to seal them under vacuum. The tube 21 is installed at the fixed position in a furnace 28 to evaporate the vapour pressure control material 26 to create a predetermined vapour pressure in the tube 21. The resulting melt 29 is contacted with the seed crystal and then the tube 21 is moved along as shown by the arrow in FIG. 3 to grow a crystal. After the crystal growth completes, the resulting crystal is take out of the reaction tube 21.

The process of the present invention is not limited to the special embodiments described above but can be changed or modified within the scope of appended claims.

Although we have described the special case of $D_{1-x}^{II} E_x^{II} F^{VI}$ type ternary mixed crystal growth, the process of the present invention is not limited to this special case but also is applicable to other types of mixed crystals such as $G^{II} H_{1-z}^{VI} I_z^{VI}$ (wherein, G is an element selected from II group and H and I are elements selected from VI group of the periodic table respectively and $0 < z < 1$).

For example, when a crystal of $CdTe_{1-z}Se_z$ is prepared according to the present invention, the vapour pressure control material can be selected from Te, Se and/or their compounds and is maintained at a temperature of $T_3$ to control the vapour pressure in the reaction system.

Further, when mixed crystals for compound semiconductors having more than four components or elements are produced by the present invention, a plurality of elements or components having higher vapour pressure may be selected from elements of which the crystal is composed and is charged as the vapour pressure control material in the vapour pressure control zone which is then heated at $T_3$.

Still more, the process according to the present invention can be applied to growth of other types of multi-component crystals such as mixed crystals for III-V group compound semiconductors, for example $GaAs_xP_{1-x}$ etc., and oxide crystals such as $(Sr, Ba)Nb_2O_6$, $LiNbO_3$, $Gd_3Sc_2Ca_3O_{12}$ etc. These crystals can be produced in the same manner as the previous cases by selecting suitable starting materials and vapour pressure control materials.

Furthermore, a capillary can be used in place of the partition wall having the through-opening.

Furthermore, the furnace can be moved relative to a stationary reaction tube.

Furthermore, as the vapour pressure control material, a mixture can be used in place of the alloy.

Now, we will show several Examples according to the process of the present invention.

EXAMPLE 1

There was prepared a mixed crystal of $Cd_{0.95}Zn_{0.05}Te$ by using the apparatus shown in FIG. 1.

At first, the boat 5 in the reaction zone 3 as shown in FIG. 1 was charged with starting material elements, Cd, Zn and Te in a predetermined amount. At the same time, a vapour pressure control material 6 of an alloy composed of $Cd_{0.99}Zn_{0.01}$ was charged in the vapour pressure control zone 4.

Then, the reaction tube 1 was vacuumed to a pressure of lower than $2 \times 10^{-6}$ torr. After that, the temperatures, $T_1$, $T_2$ and $T_3$ of the furnace 8 were adjusted to 1110° C., 1050° C. and 800° to 830° C. respectively so as to melt the starting material elements in the boat 5 and hold the vapour pressure in the reaction zone 1 at a determined pressure. Then, the reaction tube 1 is moved in the direction of the arrow shown in FIG. 1 at a rate of 3 mm/h to grow a crystal.

FIG. 5 shows the relation between the specific resistance or resistibility of the resulting mixed crystal and the temperature in the vapour pressure control zone 4.

The boat 5 was made of quartz coated with a carbon film formed by thermal cracking of high purity benzene. In the starting material elements, Cd was etched with a 10% nitric acid-ethanol solution, while Zn and Te were etched with a 10% hydrochloric acid before use.

It is apparent from FIG. 5 that, according to the present invention, it is possible to control the conductivity of p-type and n-type by controlling the temperature in the vapour pressure control zone and to obtain a crystal of CdZnTe having a higher specific resistance in the order of $10^8$ Ω-cm as a non-doped crystal and being extremely excellent in quality.

As a comparative example, a mixed crystal was prepared under similar conditions to the above example, except that only Cd is charged in the vapour pressure control zone 4 to control the vapour pressure in the reaction system only with Cd. There is also shown in FIG. 5, the relation between the specific resistance of the resulting mixed crystal and the temperature in the vapour pressure control zone 4. In this comparative example, when Cd was used in a small amount, Zn was condensed in the vapour pressure control zone. As a result, Te exceeded the stoichiometry in the boat 5 and hence in the vapour pressure control zone 4 Te condense to form an alloy with said Cd. As the result, the vapour pressure in the reaction system falls so that the crystal growth could not be performed normally. Moreover, as shown in FIG. 5 the specific resistance or resistibility of the resultant crystal was also low.

EXAMPLE 2

A mixed crystal of $Cd_{0.96}Zn_{0.04}Te$ was produced in the same apparatus shown in FIG. 1. The boat 5 of quartz coated with carbon was charged with predetermined amounts of Cd, Zn and Te in the reaction tube 3. In the vapour pressure control zone 4, an alloy of $Cd_{0.96}Zn_{0.04}$ was placed as the vapour pressure control material. Then, the interior of the reaction tube 1 was displaced with high purity Argon gas and reduced in pressure below $8\times10^{-7}$ torr and then sealed.

Temperature gradient in the furnace 8 was adjusted to $T_1=1140°$ C., $T_2=1080°$ C. and $T_3=820°$ C. respectively to melt the starting material in the boat 5 with maintaining the vapour pressure in the reaction tube 1 at a predetermined value.

Then, the temperatures $T_1$ and $T_2$ were brought down at a rate of 0.2° C./hour by controlling portions of the furnace 8 corresponding to the $T_1$ and $T_2$, while both $T_3$ and the vapour pressure in the reaction tube were kept constant, to change the distribution of temperature in the tube in order to grow a mixed crystal from the melt of the starting material.

Figure 6:
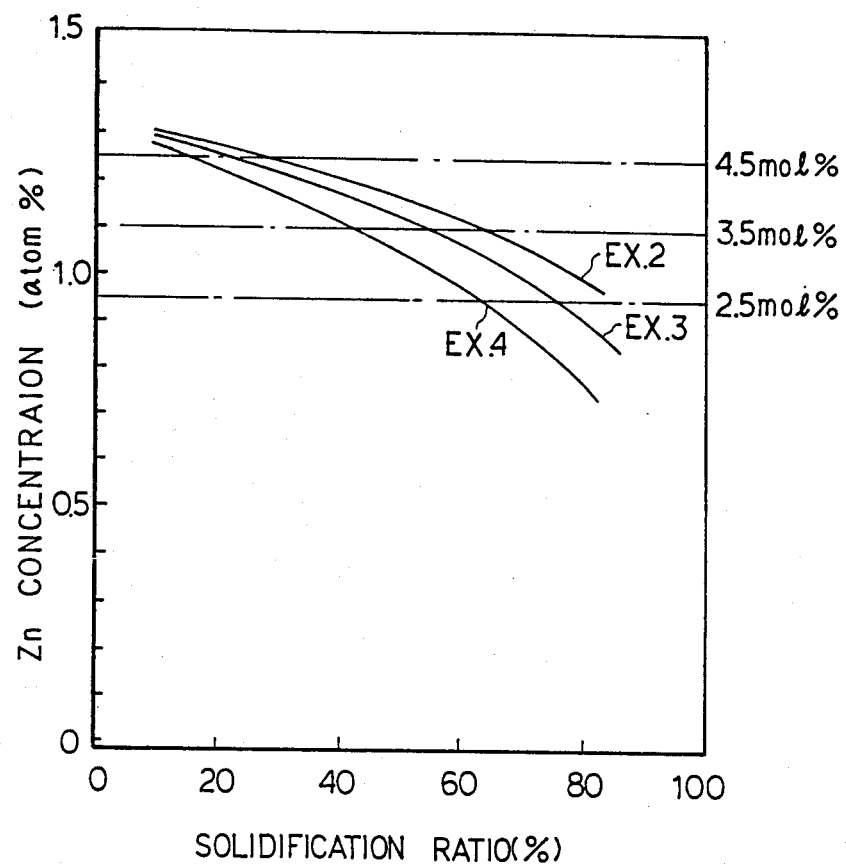
FIG. 6 illustrates the concentration of Zn in the mixed crystal produced according to Example 2 to 4 with respect to the solidification ratio.
Figure 7:
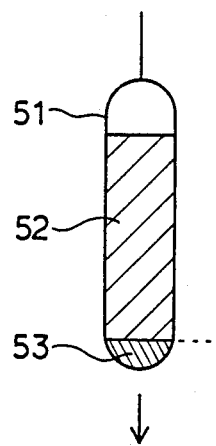
FIGS. 7, 8, 9, and 10 are schematical drawings which show conventional method for growing crystals.
Figure 8:
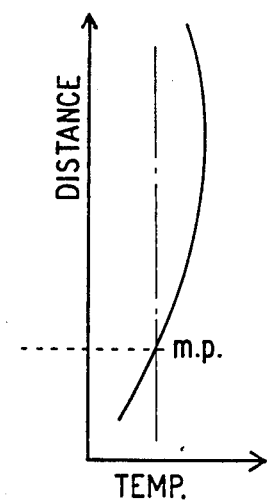
Figure 9:
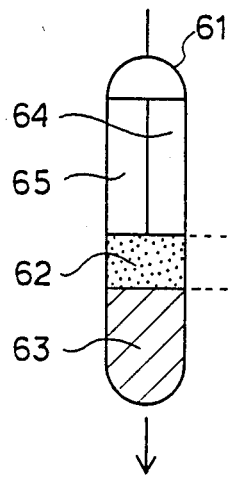
Figure 10:
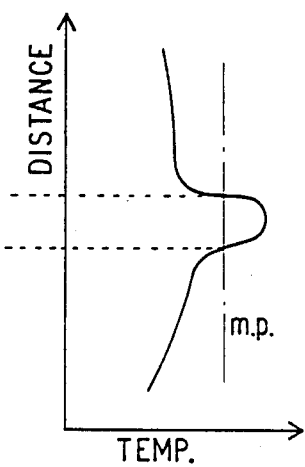

FIG. 6 shows the concentration of Zn in the resulting mixed crystal with respect to the solidification rate thereof.

EXAMPLES 3 and 4

The same procedure as Example 2 was repeated except that alloys of $Cd_{0.98}Zn_{0.02}$ and of $Cd_{0.99}Zn_{0.01}$ were used as the vapour pressure control material.

The above mentioned relations between the concentration of Zn and the solidification rate in Examples 3 and 4 are also shown in FIG. 6.

It is apparent from FIG. 4 that the mixed crystals obtained by Examples 2 to 4 have lower segregation coefficients K determined by the following equation:

$$C=KC_0(1-g)^{k-1}$$

(wherein, C is the concentration of Zn in a crystal, Co is the initial concentration of Zn, and g is the solidification ratio). Particularly, in a mixed crystal obtained from an alloy containing a higher content of Zn, the segregation coefficient became much lower and the distribution in concentration of Zn became more constant, resulting in improvement in the productivity or yield of acceptable crystal which falls within a predetermined allowable range (for example, in Example 2 to 4, the concentration range of Zn in the crystal falls within $4.0\pm0.5$ mol %).

The resulting mixed crystal showed higher specific resistance of more than $10^5$ Ω-cm under all vapour pressures and hence can become a crystal of high specific resistance or resistibility without any dopant. Furthermore, the crystal obtained by the present invention showed an improved etch-pit density (measured with Nakagawa solution) of 5000 to 40,000 pits/cm² which is one order higher with respect to conventional crystls. In this crystal, no lattice defects such as twin, polycrystal etc. were observed and no cellular structure was observed in the distribution of etch-pits.

Thus, this method for growing a crystal by controlling the distribution of temperature in the furnace can improve greatly the properties of the resulting crystal in comparison with a method in which either the furnace or the reaction tube is moved.

Conclusively, the process for producing multi-component crystals according to the present invention in which the vapour pressure in the reaction system is controlled with that of more than two elements or components of the multi-component crystal make it possible to control the composition of the resulting crystal stoichiometrically to produce uniform multi-component crystals of high quality and to improve the yield due to lowered segregation coefficient.

I claim:

1. A process for growing a multi-component type crystal from the melt of a starting material consisting of more than three elements in a sealed reaction container divided internally into two zones consisting of a reaction zone and a vapor pressure control zone which are in communication through at least one opening, characterized by the steps of placing said starting material for the multi-component crystal in said reaction zone while a vapor pressure control material consisting of more than two elements which are constituent elements of said multi-component crystal and are volatile as compared with the rest of constituent elements of said multi-component crystal is placed in said vapor pressure control zone, raising the temperature in the reaction zone to fuse said starting material while said vapor pressure control material in said vapor pressure control zone is heated to such a temperature that is sufficiently high to cause the formation and maintenance of a vapor pressure of said pressure control material in said vapor pressure control zone, creating such a temperature gradient in said reaction zone that a first portion of said reaction zone is maintained lower than a melting point of the multi-component crystal and a second portion of said reaction zone is maintained higher than the melting point in such a manner that the fused front of the starting material is created between the first portion and the second portion, and then effecting a relative motion between said sealed reaction container and a heating means surrounding the sealed container so that the fused front is retracted gradually until the total of the fused material is solidified.

2. A process for growing a multi-component type crystal as claimed in claim 1, wherein the crystal is grown by the three-temperature horizontal Bridgman method.

3. A process as set forth in claim 1, characterized in that said multi-component type crystal is a mixed crystal composed of a combination of three elements selected from group II and group VI of the periodic table.

4. A process as set forth in claim 3, characterized in that said combination is Cd-Zn-Te.

5. A process as set forth in claim 4, characterized in that said vapor pressure control material is an alloy of Cd and Zn.

6. A process as set forth in claim 1, characterized in that said combination is Cd-Zn-Se.

7. A process for growing a three-component type crystal from the melt of a starting material consisting of three elements in a sealed reaction container divided internally into two zones cocsisting of a reaction zone and a vapor pressure control zone which are in communication through at least one opening, characterized by the steps of placing said starting material in said reaction zone while a vapor pressure control material consisting of two elements which are constituent elements of said three-component crystal and are volatile as compared with the rest of constituent elements of said multi-component crystal is placed in said vapor pressure control zone, raising the temperature in said reaction zone to fuse said starting material while said vapor pressure control material in said vapor pressure control zone is heated to such a temperature that is sufficiently high to cause formation and maintenance of a vapor pressure of said pressure control material in said vapor pressure control zone, creating such a temperature gradient in said reaction zone that a first portion of said reaction zone is maintained lower than a melting point of the three-component crystal and a second portion of said reaction zone is maintained higher than said melting point in such a manner that the fused front of the starting material is created between the first portion and the second portion, and then effecting a relative motion between said sealed reaction container and a heating means surrounding the sealed container so that the fused front is retracted gradually until the total of the fused material is solidified.

8. A process set forth in claim 7, characterized in that said three-component type crystal is a mixed crystal composed of a combination of three elements selected from group II and group VI of the periodic table.

9. A process as set forth in claim 8, characterized in that said combination is Cd-Zn-Te.

10. A process as set forth in claim 9, characterized in that said vapor pressure control material is an alloy of Cd and Zn.

11. A process for growing a mixed semiconductor crystal composed of Cd, Zn, and Te from the melt of a starting material consisting of Cd, Zn and Te in a sealed reaction container divided internally into two zones consisting of a reaction zone and a vapor pressure control zone which are in communication through at least one opening, characterized by the steps of placing said starting material in said reaction zone while a vapor pressure control material consisting of an alloy Cd and Zn is placed in said vapor pressure control zone, raising the temperature in said reaction zone to fuse said starting material while said vapor pressure control material in said vapor pressure control zone is heated to such a temperature that is sufficiently high to cause the formation and maintenance of a vapor pressure of said pressure control material in said vapor pressure control zone, creating such a temperature gradient in said reaction zone that a first portion of said reaction zone is maintained lower than a melting point of the crystal and a second portion of said reaction zone is maintained higher than said melting point in such a manner that the fused front of the starting material is created between the first portion and the second portion, and then effecting a relative motion between said sealed reaction container and a heating means surrounding the sealed container so that the fused front is retracted gradually until the total of the fused material is solidified.

* * * * *